United States Patent
Yamada

(10) Patent No.: US 7,608,810 B2
(45) Date of Patent: Oct. 27, 2009

(54) SEMICONDUCTOR DEVICE, MODULE, AND ELECTRONIC DEVICE INCLUDING A CONVERSION CIRCUIT HAVING A SECOND SWITCH RENDERED CONDUCTIVE TOGETHER WITH A FIRST SWITCH

(75) Inventor: Nobuyuki Yamada, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 52 days.

(21) Appl. No.: 11/996,209

(22) PCT Filed: Jul. 14, 2006

(86) PCT No.: PCT/JP2006/314062

§ 371 (c)(1),
(2), (4) Date: Jan. 18, 2008

(87) PCT Pub. No.: WO2007/010854

PCT Pub. Date: Jan. 25, 2007

(65) Prior Publication Data

US 2009/0032682 A1    Feb. 5, 2009

(30) Foreign Application Priority Data

Jul. 22, 2005    (JP) ............... 2005-213303

(51) Int. Cl.
    H01J 40/14    (2006.01)

(52) U.S. Cl. ................. 250/214 R; 250/208.1

(58) Field of Classification Search ............ 250/214 R, 250/214.1, 208.1, 214 LS, 214 SW; 348/241–294, 348/302–308; 257/290–292, 440; 358/530, 358/436–448, 468
See application file for complete search history.

(56) References Cited

U.S. PATENT DOCUMENTS

| | | | |
|---|---|---|---|
| 5,274,601 A | 12/1993 | Kawahara et al. | |
| 6,952,226 B2 * | 10/2005 | Zhang et al. | ................ 348/294 |
| 2004/0195491 A1 | 10/2004 | Machida | |

FOREIGN PATENT DOCUMENTS

| | | |
|---|---|---|
| CN | 1571167 | 1/2005 |
| JP | 05-210976 | 8/1993 |
| JP | 2002-101264 | 4/2002 |
| JP | 2005-12752 | 1/2005 |

* cited by examiner

Primary Examiner—Que T Le
(74) Attorney, Agent, or Firm—Fish & Richardson P.C.

(57) ABSTRACT

The breakdown voltage between the potential of a terminal and the ground potential (or power supply potential) is improved by increasing the gate width of an MOS transistor included in a switch. Accordingly, another switch and the like are protected even when surge is applied to the terminal. By increasing the gate width of the MOS transistor included in the switch, the size of the other switch does not have to be increased. Therefore, variation in the potential at a node occurring when the other switch attains a non-conductive state from a conductive state can be suppressed. Therefore, a semiconductor device having the electrostatic breakdown voltage improved without influence on processing carried out based on an input potential from an external source, a module including a plurality of such semiconductor devices, and an electronic device including such a module can be provided.

18 Claims, 7 Drawing Sheets

SEMICONDUCTOR DEVICE, MODULE, AND ELECTRONIC DEVICE INCLUDING A CONVERSION CIRCUIT HAVING A SECOND SWITCH RENDERED CONDUCTIVE TOGETHER WITH A FIRST SWITCH

TECHNICAL FIELD

The present invention relates to a semiconductor device, a module including a plurality of semiconductor devices, and an electronic device including such a module. More specifically, the present invention relates to an image sensor IC (Integrated Circuit) employed for document reading, image input, and the like, an image sensor device including a plurality of image sensor ICs, and an electronic device including this image sensor device.

BACKGROUND ART

Conventionally, an image sensor device having a plurality of image sensor ICs aligned linearly to directly read out information such as characters and images on a document is used extensively in electronic devices such as facsimile apparatus, copy machines, and scanners (hereinafter, referred to as "image input device").

FIG. 9 schematically represents a basic configuration of an image sensor IC. Referring to FIG. 9, an image sensor IC 111 includes a photoelectric converter 112 converting received light into an electrical signal, and a clamp circuit 114. Potential VREF is an externally applied constant potential via a terminal T102.

In photoelectric converter 112, a plurality of pixels (not shown) are linearly aligned. Each pixel generates an electrical signal corresponding to the intensity of the received light. The electrical signal from each pixel is amplified by an amplifier circuit (not shown) in photoelectric converter 112. The signal output from photoelectric converter 112 has the offset voltage output from the amplifier circuit overlaid, whereby the potential that will be used as a reference for the signal will be deviated from potential VREF. The offset voltage attains the level of, for example, several ten to several hundred mV.

Clamp circuit 114 includes a switch SW101 to set the potential of a node NA at the level of potential VREF, and a capacitor C100 connected between the output terminal of photoelectric converter 112 and node NA. Switch SW101 is formed of, for example, an N channel MOS transistor, a transmission gate, or the like.

At clamp circuit 114, conduction of switch SW101 causes the potential of node NA to attain potential VREF. Then, switch SW101 is rendered non-conductive, and a signal is delivered from photoelectric converter 112 via capacitor C100. The potential at node NA varies with potential VREF as a basis, corresponding to the signal from photoelectric converter 112. Thus, capacitor C100 serves to cut off the direct current component of the signal output from photoelectric converter 112.

The dynamic range of the signal set at a control unit (not shown) will be reduced unless the level of the reference potential of the signal output from each of the plurality of image sensor ICs is consistent. Such a smaller dynamic range will disallow reproduction of the tone of the original image, leading to the problem of degradation in the resolution of the reproduced image. This problem can be solved by having the reference potential of the signal fixed to the level of potential VREF by the clamp circuit included in each IC.

A differential amplifier circuit A102 is provided between clamp circuit 114 and terminal T101. Differential amplifier circuit A102 has its non-inversion input terminal connected to node NA and its inversion input terminal as well as its output terminal connected to terminal T101 to carry out impedance conversion. Diodes D101 and D102 function as output protection circuits whereas diodes D103 and D104 function as input protection circuits.

Various conventional image sensor ICs based on an improvement of image sensor IC 111 are proposed. For example, Japanese Patent Laying-Open No. 2002-101264 (Patent Document 1) discloses an image sensor IC (image sensor chip) that suppresses variation in the potential difference across the clamp capacitance by providing a resistor between a reference potential input terminal and a signal output terminal.

FIG. 10 schematically represents a configuration of an image sensor IC disclosed in Japanese Patent Laying-Open No. 2002-101264 (Patent Document 1). Referring to FIG. 10, an image sensor IC 111A differs from image sensor IC 111 shown in FIG. 9 in that a resistor R100 is further provided between terminal T102 and clamp circuit 114. The configuration of the remaining elements are similar, and will not be repeated here.

At image sensor IC 111A, a highpass filter is established by capacitor C100 and resistor R100. Even if random noise is generated between photoelectric converter 112 and clamp circuit 114, variation in the potential difference across capacitor C100 can be suppressed by the highpass filter functioning to remove the noise. Accordingly, variation in the clamp level between each image sensor IC can be suppressed to allow an image signal of high quality.

Patent Document 1: Japanese Patent Laying-Open No. 2002-101264

DISCLOSURE OF THE INVENTION

Problems to be Solved by the Invention

The image sensor device is movable in many image input devices, and is connected to an affixed circuit board by a flexible cable. The flexible cable has the behavior of an antenna and may receive noise, if generated in the image input device.

A circuit connected to a terminal in a semiconductor device is readily susceptible to noise since it is directly connected to an external source via the terminal. Noise of a level that destroys the transistor is called "surge". This surge will cause damage of the gate insulation film of the MOS transistor. Therefore, a breakdown voltage (electrostatic breakdown voltage) of a sufficient level against surge is required for the MOS transistor.

As the operation of the image input device is increased in speed, the possibility of noise being generated from the electronic components in the image input device becomes higher, leading to the high possibility of the flexible cable receiving the noise. In the case of image sensor IC 111, terminals T101 and T102 are connected to the flexible cable. The provision of diodes D101-D104 at respective terminals for surge-protection will not prevent the possibility of the internal circuit being affected by the surge via the metal interconnection connected to the terminal.

Since the effect of surge applied through terminal T102 identified as an input terminal is particularly great, switch SW101 must be protected from surge at image sensor IC 111. The electrostatic breakdown voltage of switch SW101 can be set higher by increasing the size of switch SW101. Specifically, the gate width of the MOS transistors constituting switch SW101 should be increased.

However, a larger size of switch SW101 will cause variation in the potential at the output side (node NA side) corresponding to the control potential input to switch SW101. The width of variation of the potential at node NA is referred to as "feed through" hereinafter. The relationship between the size of switch SW101 and feed through will be described hereinafter.

FIG. 11 represents a configuration of switch SW101 shown in FIG. 9. Referring to FIG. 11, switch SW101 includes an N channel MOS transistor 121 and a P channel MOS transistor 122. Node NA has one end of N channel MOS transistor 121 and one end of P channel MOS transistor 122 connected in common. Terminal T102 has the other end of N channel MOS transistor 121 and the other end of P channel MOS transistor 122 connected in common.

When switch SW101 is conductive, the gate potential of N channel MOS transistor 121 is set at 3.3V, for example, and the gate potential of P channel MOS transistor 122 is set at 0V, for example. When switch SW101 is not conductive, the gate potential of N channel MOS transistor 121 is set at 0V, and the gate potential of P channel MOS transistor 122 is set at 3.3V.

Parasitic capacitance C101 is present between one end (drain or source) at the node NA side and the gate of N channel MOS transistor 121. Further, parasitic capacitance C102 is present between one end at the node NA side and the gate of P channel MOS transistor122. Parasitic capacitances C101 and C102 correspond to the capacitance generated between the gate electrode of the MOS transistor and the drain region (or source region) that spreads as far as below the gate electrode with a gate oxide film therebetween, and is generally called "overlap capacitance".

The overlap capacitance becomes larger as the gate of the MOS transistor becomes wider. The deviation of the potential at node NA from potential VREF occurring when switch SW101 is switched from a conductive state to a non-conductive state is facilitated as parasitic capacitances C101 and C102 become larger. In other words, the feed through is increased. The direction of variation of the potential at node NA depends on parasitic capacitances C101 and C102.

Thus, the feed through will become larger if the size of switch SW101 is increased for the purpose of raising the electrostatic breakdown voltage at image sensor IC 111.

In the case of image sensor IC 111A of FIG. 10, the electrostatic breakdown voltage can be increased by setting the resistance value of resistor R100 at a relatively high level (for example, approximately several kΩ). In this case, generation of feed through can be suppressed since the size of switch SW101 does not have to be increased.

However, when switch SW101 is rendered conductive, the potential of node NA will vary according to the time constant that is determined by (sum of resistance of resistor R100 and resistance of switch SW101)×(capacitance of capacitor C100). The time required for the potential of node NA to reach the level of potential VREF becomes longer as the resistance of resistor R100 becomes higher. Therefore, the output timing of the signal from photoelectric converter 112 must be delayed.

Thus, there is a possibility of reduction in the operation rate at image sensor IC 111A as the electrostatic breakdown voltage is increased.

It was difficult to improve the electrostatic breakdown voltage without influence on the operation in a conventional semiconductor device that carries out processing based on an externally applied input potential.

An object of the present invention is to provide a semiconductor device having the electrostatic breakdown voltage improved without influence on processing carried out based on an input potential from an external source, a module including a plurality of such semiconductor devices, and an electronic device including such a module.

Means for Solving the Problems

The present invention is directed to a semiconductor device, including an input terminal receiving an input potential, and a conversion circuit receiving and shifting a first signal to output a second signal based on the input potential as a reference. The conversion circuit includes a capacitor connected between a first node to which the first signal is input and a second node from which the second signal is output, a first switch provided between the second node and an intermediate node, and a second switch provided between the intermediate node and the input terminal, rendered conductive together with the first switch.

Preferably, the conversion circuit holds the reference of the second signal at the input potential.

Preferably, the semiconductor device further includes a photoelectric converter converting incident light into an electrical signal to output the first signal.

Preferably, the first switch includes a first MOS transistor connected between an other end and the intermediate node. The second switch includes a second MOS transistor connected between the input terminal and the intermediate node, receiving a constant potential at a back gate. The gate width of the second MOS transistor is larger than the gate width of the first MOS transistor.

More preferably, the semiconductor device further includes a control circuit controlling the first and second MOS transistors. The control circuit sets the second MOS transistor to a non-conductive state after setting the first MOS transistor to a non-conductive state.

Further preferably, the control circuit sets the first MOS transistor to a conductive state after setting the second MOS transistor to a conductive state.

According to another aspect of the present invention, a module includes a plurality of semiconductor devices. Each of the plurality of semiconductor devices includes an input terminal receiving an input potential, and a conversion circuit receiving and shifting a first signal to output a second signal based on the input potential as a reference. The conversion circuit includes a capacitor connected between a first node to which the first signal is input and a second node from which the second signal is output, a first switch provided between the second node and an intermediate node, and a second switch provided between the intermediate node and the input terminal, rendered conductive together with the first switch.

Preferably, the conversion circuit holds the reference of the second signal at the input potential.

Preferably, each of the plurality of semiconductor devices further includes a photoelectric converter converting incident light into an electrical signal to output the first signal.

Preferably, the first switch includes a first MOS transistor connected between an other end and the intermediate node. The second switch includes a second MOS transistor connected between the input terminal and the intermediate node, receiving a constant potential at a back gate. The gate width of the second MOS transistor is larger than the gate width of the first MOS transistor.

More preferably, each of the plurality of semiconductor devices further includes a control circuit controlling the first and second MOS transistors. The control circuit sets the second MOS transistor to a non-conductive state after setting the first MOS transistor to a non-conductive state.

Further preferably, the control circuit sets the first MOS transistor to a conductive state after setting the second MOS transistor to a conductive state.

According to a further aspect of the present invention, an electronic device includes a module including a plurality of semiconductor devices. Each of the plurality of semiconductor devices includes an input terminal receiving an input potential, and a conversion circuit receiving and shifting a first signal to output a second signal based on the input potential as a reference. The conversion circuit includes a capacitor connected between a first node to which the first signal is input and a second node from which the second signal is output, a first switch provided between the second node and an intermediate node, and a second switch provided between the intermediate node and the input terminal, rendered conductive together with the first switch.

Preferably, the conversion circuit holds the reference of the second signal at the input potential.

Preferably, each of the plurality of semiconductor devices further includes a photoelectric converter converting incident light into an electrical signal to output the first signal.

Preferably, the first switch includes a first MOS transistor connected between an other end and the intermediate node. The second switch includes a second MOS transistor connected between the input terminal and the intermediate node, receiving a constant potential at a back gate. The gate width of the second MOS transistor is larger than the gate width of the first MOS transistor.

More preferably, each of the plurality of semiconductor devices further includes a control circuit controlling the first and second MOS transistors. The control circuit sets the second MOS transistor to a non-conductive state after setting the first MOS transistor to a non-conductive state.

Further preferably, the control circuit sets the first MOS transistor to a conductive state after setting the second MOS transistor to a conductive state.

EFFECTS OF THE INVENTION

According to the semiconductor device of the present invention, the electrostatic breakdown voltage can be improved without affecting the operation of a conversion circuit that shifts a signal such that a reference of the signal attains the level of an externally applied input potential by providing a switch connected between the conversion circuit and an input terminal to which the input potential is applied.

According to the module and electronic device including a plurality of semiconductor devices set forth above of the present invention, stable operation can be realized.

Figure 1:
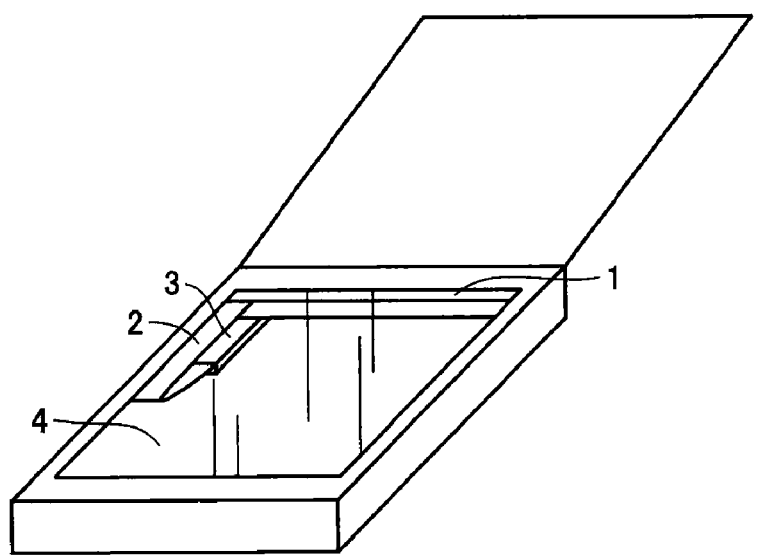
FIG. 1 represents an example of an electronic device of the present invention.

DESCRIPTION OF THE REFERENCE CHARACTERS 1 image sensor head; 2 flexible cable; 3 control unit; 4 glass; 11 circuit board; 12, 112 photoelectric converter; 14, 114 clamp circuit; 15 switch control circuit; 21, 24, 32, 121 N channel MOS transistor; 22, 25, 31, 122 P channel MOS transistor; 23, 33 inverter; 41 semiconductor substrate; 42-44, 51 diffusion layer; 45 gate oxide film; 46 gate electrode; 47 silicide; 100 scanner; 101-10$m$, 111, 111A image sensor IC; A1, A2, A102 differential amplifier circuit; C1, C100 capacitor; C101, C102 parasitic capacitance; D1-D4, D101-D104 diode; N0-N4, N11, N12, N21, N22; NA node; P1-Pn pixel; T1, T2, T101, T102 terminal; R1, R2, R100 resistor; RDSW1-RDSWn, SW0-SW2, SW101 switch.

BEST MODES FOR CARRYING OUT THE INVENTION

Embodiments of the present invention will be described in detail with reference to the drawings hereinafter. In the drawings, the same reference characters represent the same or corresponding elements.

FIG. 1 represents an example of an electronic device of the present invention. Referring to FIG. 1, a scanner 100 is illustrated as an example of the electronic device of the present invention. Scanner 100 includes an image sensor head 1, a flexible cable 2 connected to image sensor head 1, a control unit 3 connected to image sensor head 1 via flexible cable 2, and glass 4 where a document on which information such as text and images are drawn is placed.

Image sensor head 1 corresponds to the module of the present invention. Image sensor head 1 is movable, and reads out the text and image from the document via glass 4 to send an image signal to control unit 3. Control unit 3 reproduces an image according to image signals.

Although scanner 100 is illustrated as a flatbed type scanner, a sheet feed scanner may be employed instead. A sheet feed scanner has the image sensor head fixed, and reads an image on the document while delivering the document by means of a roller that rotates at a predetermined rate. The electronic device of the present invention is not limited to a scanner, and may be a facsimile apparatus, copy machine, or the like.

Figure 2:
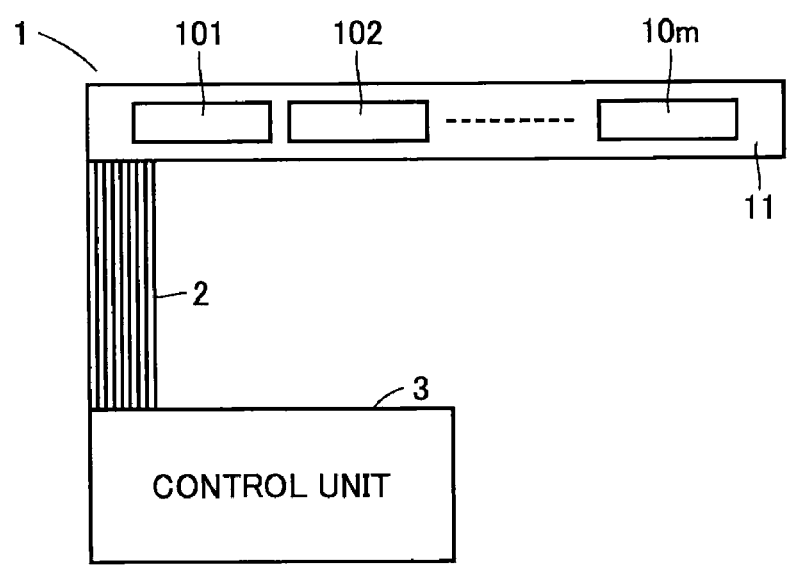
FIG. 2 represents an example of a configuration of an image sensor head 1 of FIG. 1.

FIG. 2 represents an example of a configuration of image sensor head 1 of FIG. 1. Referring to FIG. 2, image sensor head 1 includes m (m is a natural number) image sensors IC 101-10$m$ arranged in one dimension. Each of the image sensors IC 101-10$m$ corresponds to a semiconductor device of the present invention. Image sensors IC 101-10$m$ are connected to flexible cable 2 via a wiring (not shown) provided on circuit board 11 to receive power supply potential, reference potential, and the like.

The reason why reference potential and the like are applied to image sensors IC 101-10$m$ via flexible cable 2 is set forth below. In the case where a power supply circuit, a reference potential generation circuit, or the like is provided at circuit board 11 for the purpose of preventing influence of noise, the size and weight of circuit board 11 will be increased. Accordingly, power consumption to move circuit board 11 becomes larger.

Another likely reason is that the reference level of the signal output from each IC may differ due to variation in the property when a reference potential generation circuit is incorporated for each of image sensor ICs 101-10m.

Image sensor ICs 101-10m are less susceptible to the influence of noise from flexible cable 2 since they are configured to protect the internal circuit from surge applied to the terminal that receives the reference potential (input potential). Therefore, the operation of image sensor head 1 and scanner 100 can be stabilized.

Figure 3:
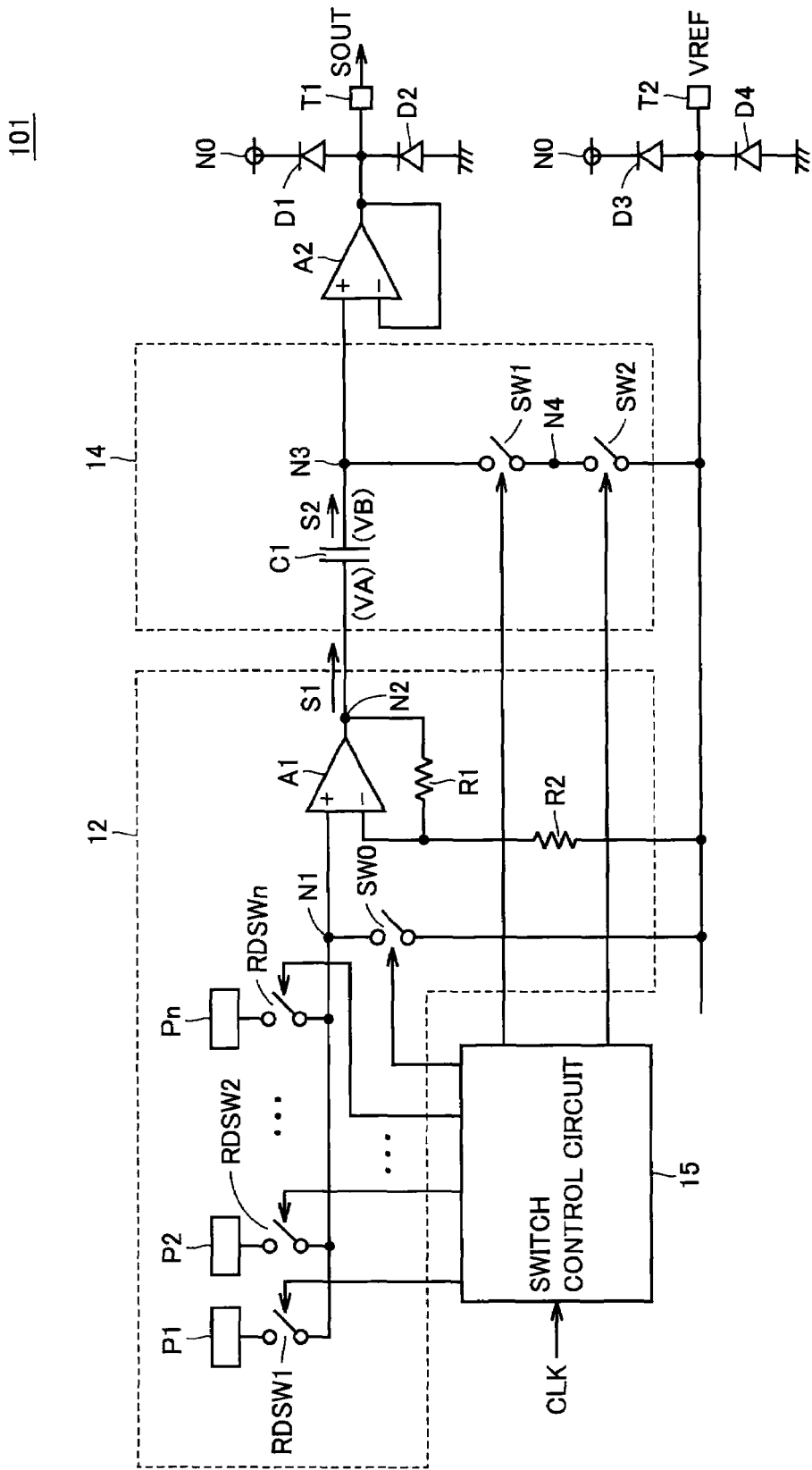
FIG. 3 represents an example of a configuration of an image sensor IC 101 of FIG. 2.

FIG. 3 represents an example of a configuration of image sensor IC 101 of FIG. 2. Referring to FIG. 3, image sensor IC 101 includes a photoelectric converter 12, a clamp circuit 14, and terminals T1 and T2.

Photoelectric converter 12 converts the incident light into an electrical signal to output a signal S1. Photoelectric converter 12 includes n (n is a natural number) pixels P1-Pn, and switches RDSW1-RDSWn provided corresponding to pixels P1-Pn, respectively. By sequentially operating switches RDSW1-RDSWn, an electrical signal is sequentially output from pixels P1-Pn.

Photoelectric converter 12 further includes a switch SW0, a differential amplifier circuit A1, and resistors R1 and R2. Switch SW0 is connected between a node N1 and terminal T2. Terminal T2 receives potential VREF (input potential). Potential VREF is a constant potential.

Differential amplifier circuit A1 has a non-inversion input terminal connected to node N1 and an inversion input terminal connected to one end of resistor R1. Resistor R1 has the other end connected to a node N2. Resistor R2 is connected between the inversion input terminal of differential amplifier circuit A1 and terminal T2.

Switch SW0 is rendered conductive prior to a signal output from the pixel, and the potential of node N1 is set at potential VREF. Differential amplifier circuit A1 amplifies the signal output from the pixel to output a signal S1 to node N2. It is to be noted that the reference potential of signal S1 is deviated from potential VREF since offset voltage is generated from differential amplifier circuit A1.

Clamp circuit 14 corresponds to "conversion circuit" of the present invention. Clamp circuit 14 shifts signal S1 to output a signal S2 based on potential VREF as a reference. Clamp circuit 14 holds the reference of signal S2 at potential VREF.

Clamp circuit 14 includes a capacitor C1 and switches SW1 and SW2. Capacitor C1 has one end connected to node N2 and the other end connected to a node N3 from which signal S2 is output. Switch SW1 is connected between node N3 and a node N4 (intermediate node). Switch SW2 is connected between node N4 and terminal T2.

Each of switches SW1 and SW2 is formed of, for example, a transmission gate. Each of switches SW1 and SW2 may be formed of an N channel MOS transistor or P channel MOS transistor. Alternatively, each of switches SW1 and SW2 may be formed of a bipolar transistor.

By increasing the gate width of the MOS transistor in switch SW2, the breakdown voltage between the potential of terminal T2 and the ground potential (or power supply potential) is improved. Accordingly, switch SW1 and the like are protected even if surge is applied to terminal T2. Further, variation in the potential at node N3 in response to switch SW1 attaining a non-conductive state from a conductive state can be suppressed since the size of switch SW1 does not have to be increased by virtue of increasing the gate width of the MOS transistor included in switch SW2.

Furthermore, the time constant determined by the capacitance of capacitor C1 and the resistance of switches SW1 and SW2 becomes smaller, and the timing of initiating output of signal S1 does not have to be delayed. Therefore, high speed operation can be accommodated.

The resistance when switch SW2 is conductive, i.e. the ON resistance of the MOS transistor, is set lower (for example, at several Ω) than the general resistance (several k Ω) of the surge protection resistor.

Image sensor IC 101 further includes a switch control circuit 15 controlling switches SW0-SW2 and RDSW1-RDSWn. Switch control circuit 15 controls the conductive and non-conductive timing of each switch according to an externally applied clock signal CLK.

Switch SW2 is rendered conductive together with SW1. When both switches SW1 and SW2 are rendered conductive, the potential of node N3 is altered to potential VREF. Then, a signal S1 is output from differential amplifier circuit A1 while switches SW1 and SW2 are both rendered non-conductive and the potential at node N3 held at the level of potential VREF.

Capacitor C1 serves to cut off the direct current component of the output signal. Therefore, in response to signal S1, the potential of signal S2 is altered based on potential VREF as a reference.

Image sensor IC 101 further includes a differential amplifier circuit A2 that functions as an impedance conversion circuit. Differential amplifier circuit A2 receives signal S2 at its non-inversion input terminal, and has its inversion input terminal and output terminal connected to terminal T1. A signal SOUT is output to an external source from terminal T1.

Image sensor IC 101 further includes diodes D1-D4 functioning as protection elements. Diode D1 is connected between a node N0 (power supply node) and terminal T1. Diode D2 is connected between terminal T1 and the ground node. Diode D3 is connected between node N0 and terminal T2. Diode D4 is connected between terminal T2 and the ground node.

The configuration of each of image sensors ICs 102-10m is similar to that of image sensor IC 101, and description thereof will not be repeated.

Figure 4:
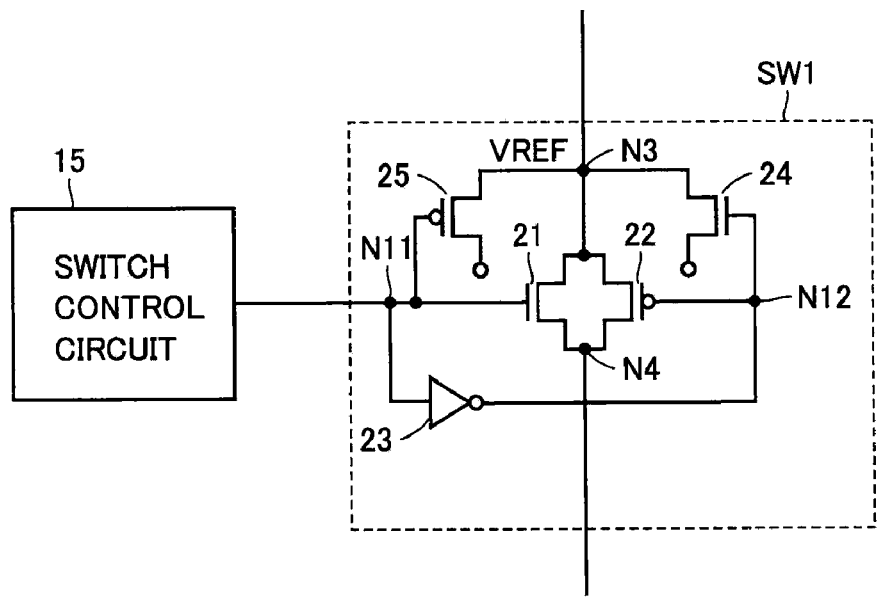
FIG. 4 represents an example of a configuration of a switch SW1 of FIG. 3.

FIG. 4 represents an example of a configuration of switch SW1 of FIG. 3. Referring to FIG. 4, switch SW1 includes an N channel MOS transistor 21, a P channel MOS transistor 22, and an inverter 23. N channel MOS transistor 21 and P channel MOS transistor 22 are connected in parallel between node N3 and node N4. N channel MOS transistor 21 has its gate connected to a node N11. P channel MOS transistor 22 has its gate connected to a node N12. Inverter 23 has its input terminal connected to node N11, and its output terminal connected to node N12.

Switch SW1 further includes an N channel MOS transistor 24 and a P channel MOS transistor 25. Although generation of feed through can be suppressed by reducing the gate width of each of N channel MOS transistor 21 and P channel MOS transistor 22, N channel MOS transistor 24 and P channel MOS transistor 25 are provided to further assist suppression of feed through.

N channel MOS transistor 24 has one end connected to node N3, the other end open, and its gate connected to node N12. The size of N channel MOS transistor 24 is identical to that of N channel MOS transistor 21.

P channel MOS transistor 25 has one end connected to node N3, the other end open, and its gate connected to node N11. The size of P channel MOS transistor 25 is identical to that of P channel MOS transistor 22.

The mechanism of suppressing feed through will be described hereinafter with N channel MOS transistors 21 and 24 as examples. The same mechanism works for P channel MOS transistors 22 and 25.

When the potential of node N11 is altered to 0 V from 3.3 V, for example, the parasitic capacitance of N channel MOS transistor 21 (the capacitance across nodes N11 and N3) is directed to reducing the potential of node N3 lower than potential VREF. However, since the potential at the gate of N channel MOS transistor 24 is raised from 0 V to 3.3 V, the parasitic capacitance of N channel MOS transistor 24 (the capacitance across nodes N12 and N3) is directed to increasing the potential of node N3 higher than potential VREF. These potential changes are cancelled since the capacitance value of each N channel MOS transistor is equal. Thus, the potential at node N3 is maintained at potential VREF.

Figure 5:
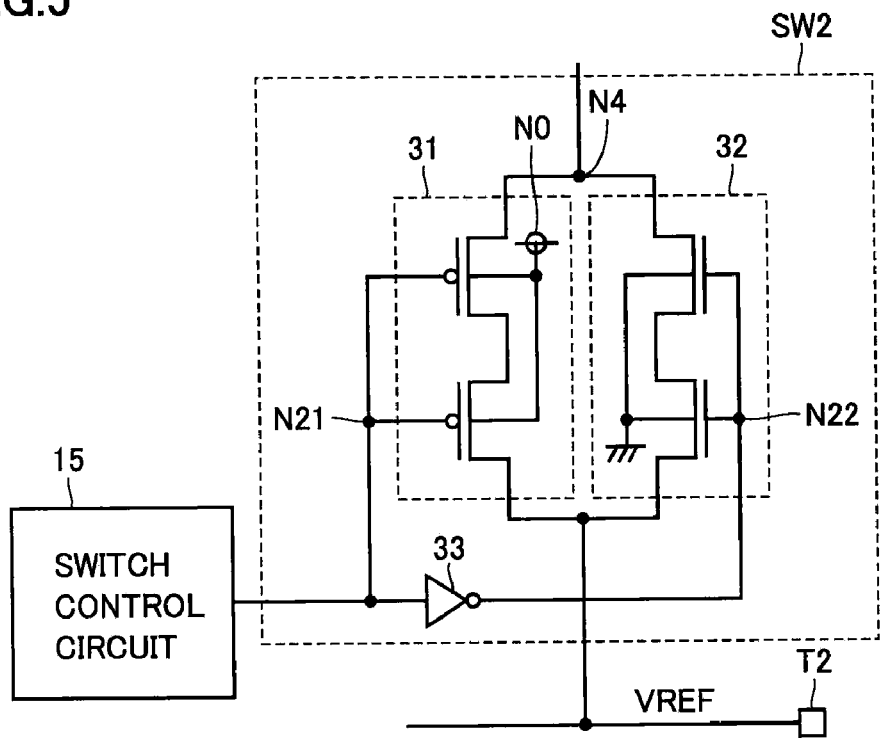
FIG. 5 represents an example of a configuration of a switch SW2 of FIG. 3.

FIG. 5 represents a configuration of switch SW2 of FIG. 3. Referring to FIG. 5, switch SW2 includes a P channel MOS transistor 31, an N channel MOS transistor 32, and an inverter 33.

P channel MOS transistor 31 is connected between node N4 and terminal T2. P channel MOS transistor 31 has its gate connected to a node N21, and its backgate connected to node N0 from which power supply potential (constant potential) is applied.

N channel MOS transistor 32 is connected between node N4 and terminal T2. N channel MOS transistor 32 has its gate connected to a node N22, and its backgate connected to the ground node from which ground potential (constant potential) is applied.

Inverter 33 has its input terminal connected to node N21, and its output terminal connected to node N22.

The gate width of P channel MOS transistor 31 is larger than the gate width of P channel MOS transistor 22. The gate width of N channel MOS transistor 32 is greater than the gate width of N channel MOS transistor 21. For example, the gate width of P channel MOS transistors 31 and 22 is approximately 170 µm and approximately 9 µm, respectively. The gate width of N channel MOS transistors 32 and 21 is approximately 53 µm and approximately 2.5 µm, respectively. Thus, the electrostatic breakdown voltage can be improved by increasing the gate width of the MOS transistor in switch SW2.

Figure 6:
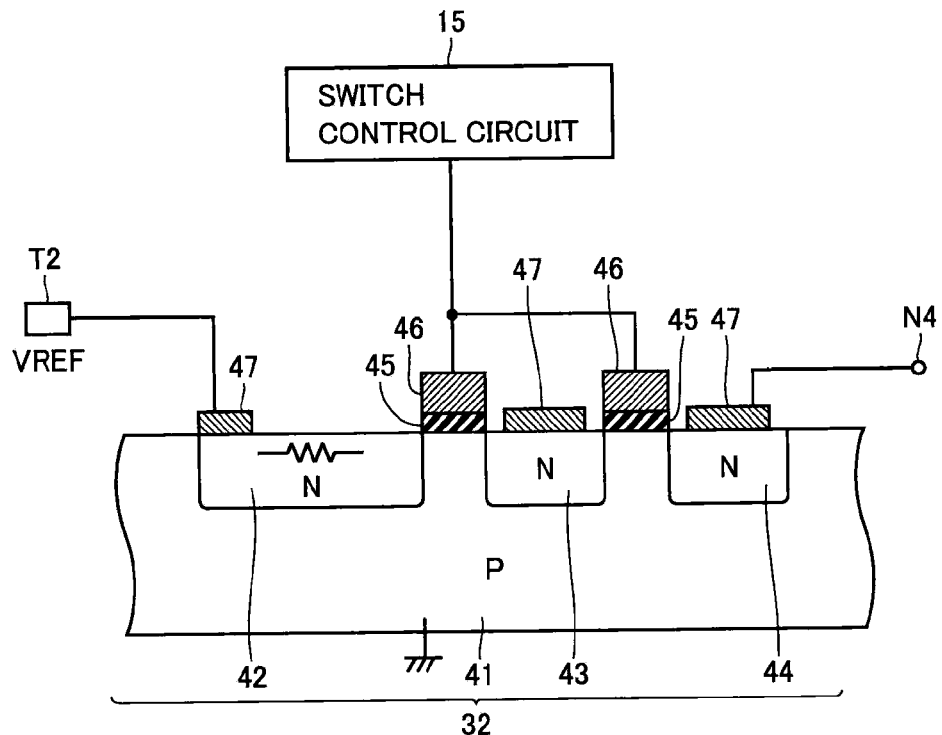
FIG. 6 is a schematic sectional view of an N channel MOS transistor 32 of FIG. 5.

FIG. 6 schematically shows a cross section of N channel MOS transistor 32 of FIG. 5. Referring to FIG. 6, N channel MOS transistor 32 is formed at a P type semiconductor substrate 41. N type diffusion layers 42-44 are formed at semiconductor substrate 41. Semiconductor substrate 41 is set at the ground potential, and serves as the backgate of N channel MOS transistor 32. Diffusion layer 42 is formed wider than other diffusion layers.

There is a channel region between diffusion layer 42 and diffusion layer 43, and between diffusion layer 43 and diffusion layer 44. A gate oxide film 45 is formed on each channel region, and a gate electrode 46 connected to switch control circuit 15 is formed on gate oxide film 45.

Silicide 47 is deposited on diffusion layers 42-44. Silicide 47 on diffusion layer 42 is located remote from the gate electrode, and is connected to terminal T2 via a metal interconnection. Silicide 47 on diffusion layer 47 is connected to node N4. Silicide 47 on diffusion layer 43 takes a floating state.

In the case where surge is applied to terminal T2, damage of gate oxide film 45 can be prevented since diffusion layer 42 functions as a resistor. Diffusion layer 42 and semiconductor substrate 41 constitute a diode. When the voltage at terminal T2 exceeds a certain overvoltage level (for example 200-400V) with respect to the ground potential, surge current flows from T2 towards the ground node through diffusion layer 42 and semiconductor substrate 41. By increasing the width of gate electrode 46, the surge current flowing through the diode can be increased.

Figure 7:
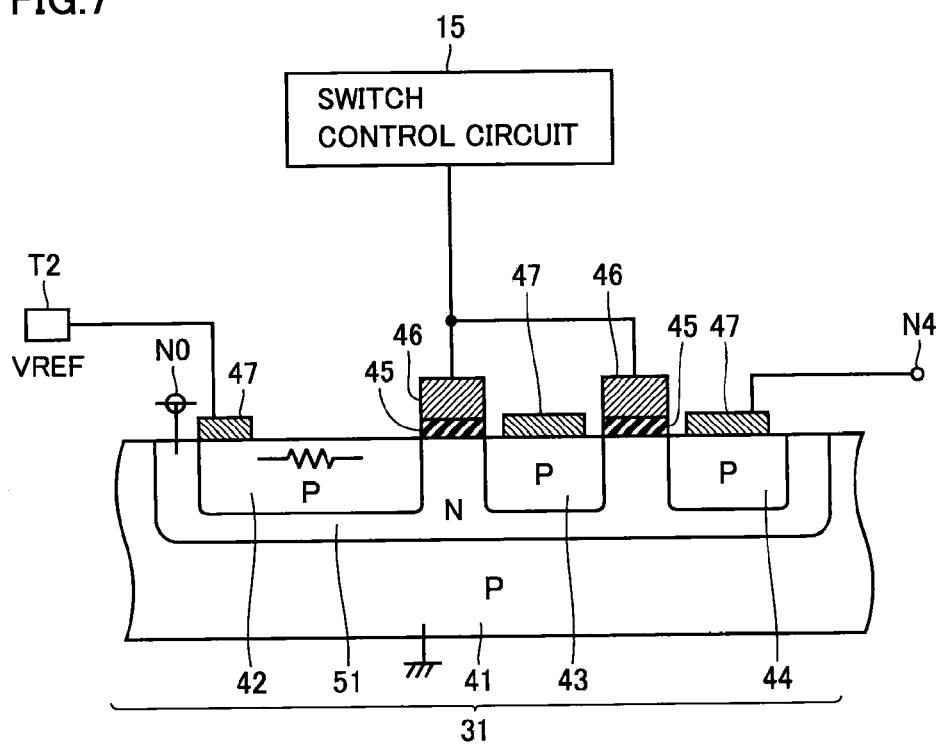
FIG. 7 is a schematic sectional view of a P channel MOS transistor 31 of FIG. 5.

FIG. 7 schematically shows a cross section of P channel MOS transistor 31 of FIG. 5. Referring to FIG. 7, P channel MOS transistor 31 differs from N channel MOS transistor 32 of FIG. 6 in that an N type diffusion layer 51 is formed at semiconductor substrate 41, and P type diffusion layers 42-44 are formed in diffusion layer 51. The remaining elements are similar to those of N channel MOS transistor 32, and description thereof will not be repeated. Diffusion layer 51 serves as the backgate of P channel MOS transistor 31, and receives the power supply potential from node N0. Diffusion layer 51 and diffusion layer 42 constitute a diode. When surge is applied in the positive direction to terminal T2, surge current flows from terminal T2 towards node N0 through diffusion layer 42 and diffusion layer 51.

Figure 8:
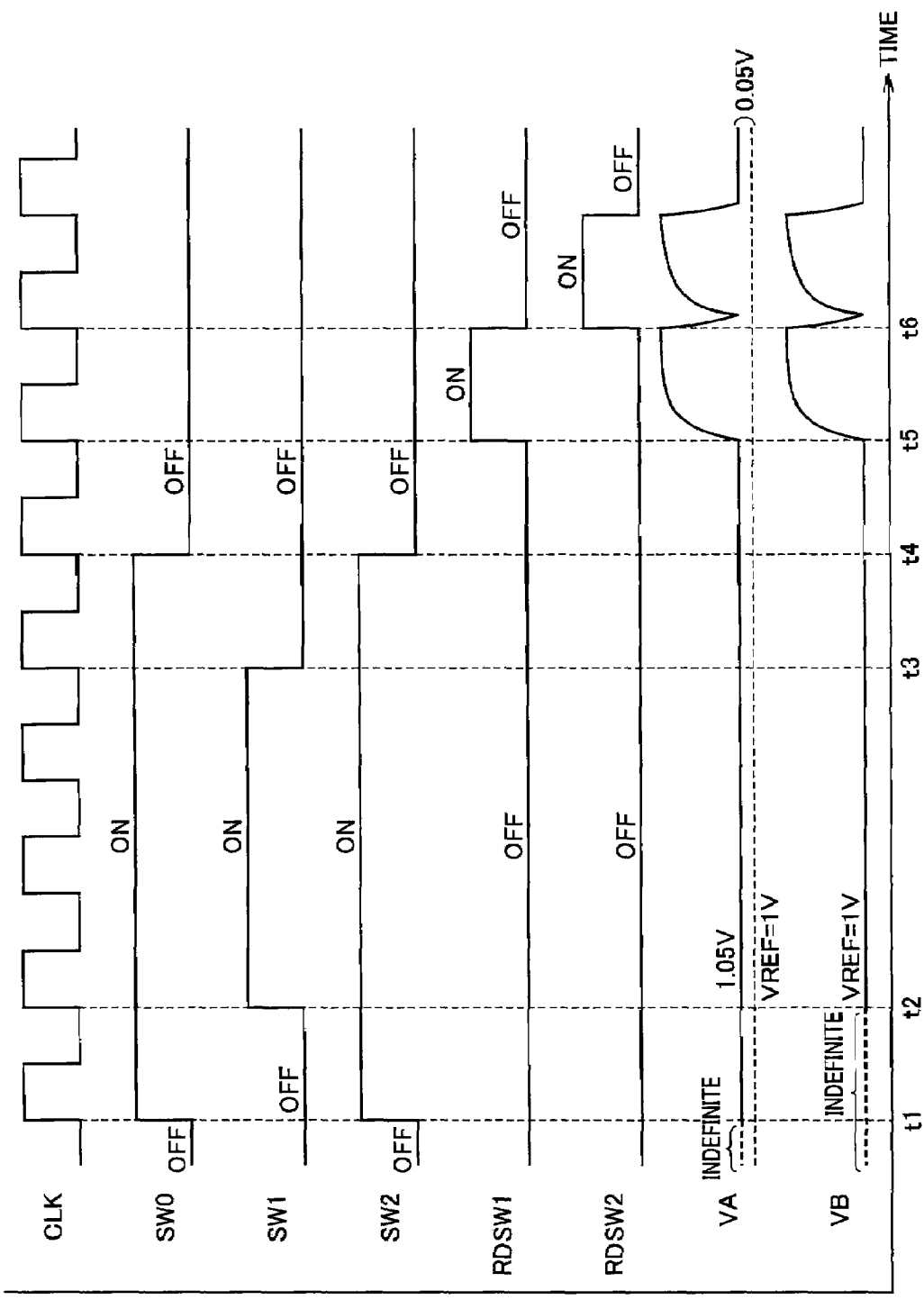
FIG. 8 is a timing chart for describing an operation of image sensor IC 101 of FIG. 2.
Figure 9:
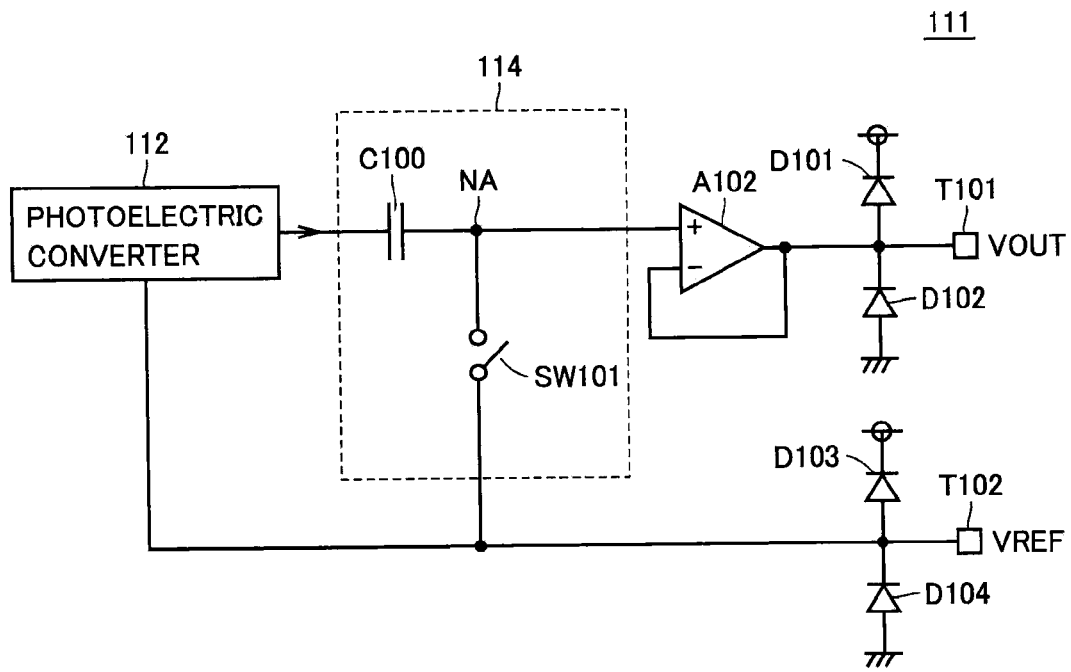
FIG. 9 is a schematic diagram representing a basic configuration of an image sensor IC.
Figure 10:
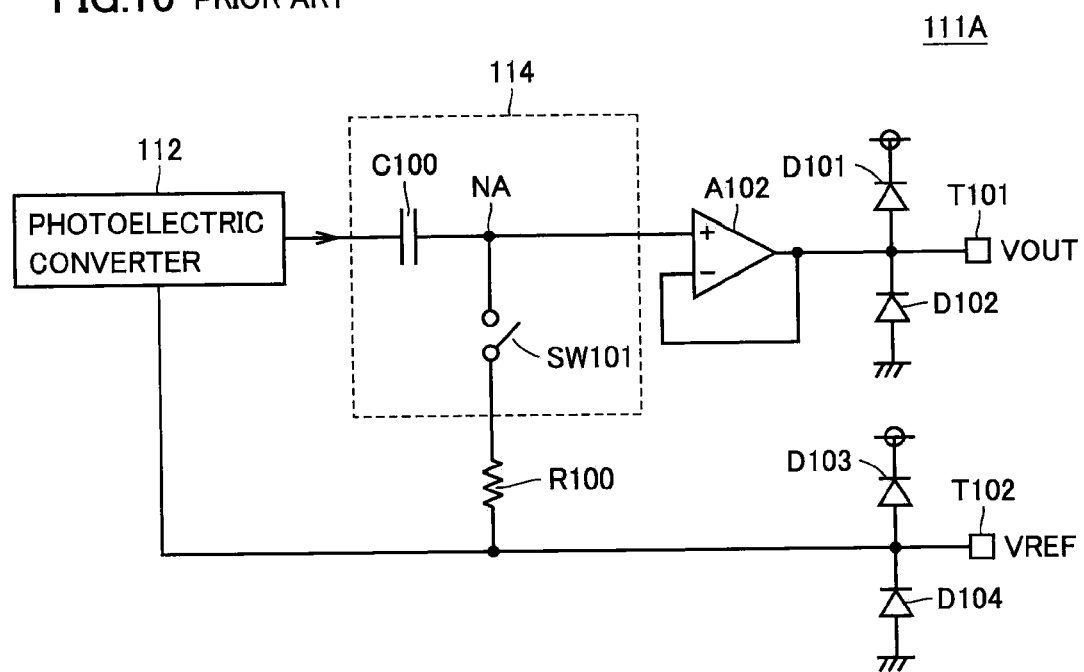
FIG. 10 schematically represents a configuration of an image sensor IC disclosed in Japanese Patent Laying-Open No. 2002-101264 (Patent Document 1).
Figure 11:
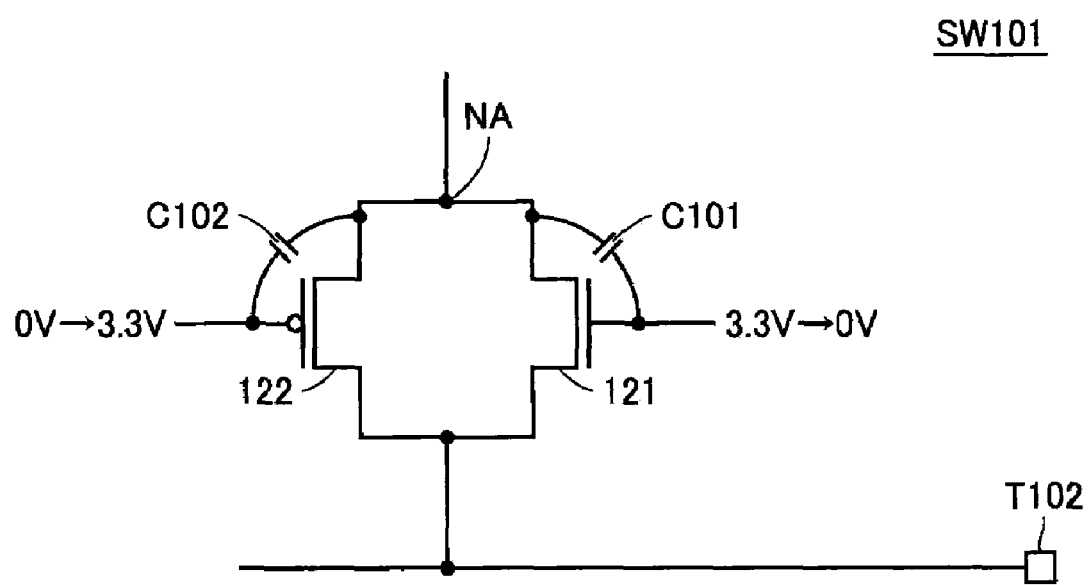
FIG. 11 represents a configuration of a switch SW101 of FIG. 9.

FIG. 8 is a timing chart for describing the operation of image sensor IC 101 of FIG. 2. Referring to FIG. 8, in response to the rise of clock signal CLK at time t1, switches SW0 and SW2 both attain a conductive state (ON state). Therefore, the potential at nodes N1 and N4 is altered to potential VREF. In FIG. 8, potential VREF is equal to 1 V.

Potentials VA and VB represent the potential of signals S1 and S2, respectively, of FIG. 3. Potential VA, indefinite prior to time t1, is altered to 1.05 V at time t1. The potential difference (0.05 V) between potential VA and potential VREF is the output offset voltage from differential amplifier circuit A1.

In response to the rise of the clock signal at time t2, switch SW1 attains a conductive state. The potential of node N3, indefinite prior to time t2, is altered to potential VREF (1 V) at time t2.

Thus, switch control circuit 15 renders switch SW1 (P channel MOS transistor 22, N channel MOS transistor 21) conductive after setting switch SW2 (P channel MOS transistor 31, N channel MOS transistor 32) conductive. Accordingly, the time required for the potential of node N3 to reach the level of potential VREF can be shortened since switch SW1 is set at a conductive state with the potential of node N4 at the level of potential VREF.

In response to the rise of clock signal CLK at time t3, switch SW1 is rendered non-conductive (OFF state). It is to be noted that potential VB remains at the level of 1V. In response to the rise of clock signal CLK at time t4, switches SW0 and SW2 are both rendered non-conductive.

Thus, switch control circuit 15 renders switch SW2 non-conductive after switch SW1 is rendered non-conductive. Therefore, potential VB is immune to switch SW2 even if switch SW2 is altered to a non-conductive state.

When switch RDSW1 attains a conductive state in response to the rise of clock signal CLK at time t5, the signal output from pixel P1 is amplified by differential amplifier circuit A1. Potential VA is altered, based on 1.05 V as a reference, whereas potential VB is altered based on 1.0 V as a reference. Then, when switch RDSW2 is rendered conductive in response to the rise of clock signal CLK at time t6, potentials VA and VB are altered in a manner likewise the period of time t5-time t6. Potential VB is altered, referenced to 1.0 V, i.e. referenced to potential VREF. Thus, clamp circuit 14 shifts signal S1 to output signal S2 based on potential VREF as a reference. In addition, clamp circuit 14 holds the reference of signal S2 at potential VREF.

According to the present embodiment of the invention set forth above, by providing a second switch between the input terminal receiving the input potential and the first switch and by increasing the size of the second switch in a semiconductor device that carries out processing based on an externally applied input potential, the electrostatic breakdown voltage can be improved since the second switch absorbs the surge.

According to present embodiment of the invention, the influence on the clamp operation can be prevented by setting the resistance value of the second switch lower than the resistance directed to surge absorption.

Further, according to an embodiment of the present invention, generation of feed through can be suppressed by setting the gate width of the MOS transistor employed in the second switch larger than the gate width of the MOS transistor employed in the first switch.

Further, according to an embodiment of the present invention, stable operation is allowed even if noise is generated in an image input device by the provision of a plurality of semiconductor devices set forth above in the image sensor head employed in the image input device.

Although an image sensor IC is taken as an example of a semiconductor device in the present embodiment, the semiconductor device of the present invention is widely applicable to a semiconductor device including a circuit that shifts a signal to output a signal that is referenced to an externally applied input potential.

It will be understood that the embodiments of the present invention disclosed herein are by way of example only, and is not to be taken by way of limitation in all aspects. The scope of the present invention is defined, not by the description set forth above, but by the appended claims, and all changes that fall within limits and bounds of the claims, or equivalence thereof are intended to be embraced by the claims.

What is claimed is:

1. A semiconductor device comprising:
an input terminal to receive an input potential, and
a conversion circuit to receive and shift a first signal to output a second signal based on said input potential as a reference, wherein said conversion circuit includes:
a capacitor connected between a first node to which said first signal is input and a second node from which said second signal is output,
a first switch provided between said second node and an intermediate node, and
a second switch provided between said intermediate node and said input terminal, rendered conductive together with said first switch.

2. The semiconductor device according to claim 1, wherein said conversion circuit holds the reference of said second signal at said input potential.

3. The semiconductor device according to claim 1, further comprising a photoelectric converter to convert incident light into an electrical signal to output said first signal.

4. The semiconductor device according to claim 1, wherein said first switch includes a first MOS transistor connected between said second node and said intermediate node,
said second switch includes a second MOS transistor connected between said input terminal and said intermediate node, receiving a constant potential at a backgate, and
said second MOS transistor has a gate width larger than the gate width of said first MOS transistor.

5. The semiconductor device according to claim 4, further comprising a control circuit to control said first and second MOS transistors,
wherein said control circuit is arranged to set said second MOS transistor to a non-conductive state after setting said first MOS transistor to a non-conductive state.

6. The semiconductor device according to claim 5, wherein said control circuit is arranged to set said first MOS transistor to a conductive state after setting said second MOS transistor to a conductive state.

7. A module, comprising:
a plurality of semiconductor devices, each of said plurality of semiconductor devices including:
an input terminal to receive an input potential, and
a conversion circuit to receive and shift a first signal to output a second signal based on said input potential as a reference, wherein said conversion circuit includes:
a capacitor connected between a first node to which said first signal is input and a second node from which said second signal is output,
a first switch provided between said second node and an intermediate node, and
a second switch provided between said intermediate node and said input terminal, rendered conductive together with said first switch.

8. The module according to claim 7, wherein said conversion circuit holds the reference of said second signal at said input potential.

9. The module according to claim 7, each of said plurality of semiconductor devices further including a photoelectric converter to convert incident light into an electrical signal to output said first signal.

10. The module according to claim 7, wherein said first switch includes a first MOS transistor connected between said second node and said intermediate node,
said second switch includes a second MOS transistor connected between said input terminal and said intermediate node, receiving a constant potential at a backgate, and
said second MOS transistor has a gate width larger than the gate width of said first MOS transistor.

11. The module according to claim 10, each of said plurality of semiconductor devices further including a control circuit to control said first and second MOS transistors,
wherein said control circuit is arranged to set said second MOS transistor to a non-conductive state after setting said first MOS transistor to a non-conductive state.

12. The module according to claim 11, wherein said control circuit is arranged to set said first MOS transistor to a conductive state after setting said second MOS transistor to a conductive state.

13. An electronic device, comprising:
a module including a plurality of semiconductor devices, each of said plurality of semiconductor devices including:
an input terminal to receive an input potential, and
a conversion circuit to receive and shift a first signal to output a second signal based on said input potential as a reference, wherein said conversion circuit includes:
a capacitor connected between a first node to which said first signal is input and a second node from which said second signal is output,
a first switch provided between said second node and an intermediate node, and
a second switch provided between said intermediate node and said input terminal, rendered conductive together with said first switch.

14. The electronic device according to claim 13, wherein said conversion circuit holds the reference of said second signal at said input potential.

15. The electronic device according to claim 13, each of said plurality of semiconductor devices further including a photoelectric converter to convert incident light into an electrical signal to output said first signal.

16. The electronic device according to claim 13, wherein
said first switch includes a first MOS transistor connected between said second node and said intermediate node,
said second switch includes a second MOS transistor connected between said input terminal and said intermediate node, receiving a constant potential at a backgate, and
said second MOS transistor has a gate width larger than the gate width of said first MOS transistor.

17. The electronic device according to claim 16, each of said plurality of semiconductor devices further including a control circuit to control said first and second MOS transistors,
wherein said control circuit is arranged to set said second MOS transistor to a non-conductive state after setting said first MOS transistor to a non-conductive state.

18. The electronic device according to claim 17, wherein said control circuit is arranged to set said first MOS transistor to a conductive state after setting said second MOS transistor to a conductive state.

* * * * *